(12) United States Patent
Yao et al.

(10) Patent No.: US 10,527,881 B2
(45) Date of Patent: Jan. 7, 2020

(54) COLOR FILTER SUBSTRATE AND METHOD OF FABRICATING A COLOR FILTER SUBSTRATE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Chengpeng Yao, Beijing (CN); Huan Ni, Beijing (CN); Xinxia Zhang, Beijing (CN); Xiaolong Xie, Beijing (CN); Qun Li, Beijing (CN); Xiao Guo, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 89 days.

(21) Appl. No.: 15/744,978

(22) PCT Filed: Mar. 17, 2017

(86) PCT No.: PCT/CN2017/077060
§ 371 (c)(1),
(2) Date: Jan. 15, 2018

(87) PCT Pub. No.: WO2018/165975
PCT Pub. Date: Sep. 20, 2018

(65) Prior Publication Data
US 2019/0011767 A1  Jan. 10, 2019

(51) Int. Cl.
*G02B 5/20* (2006.01)
*G02F 1/1335* (2006.01)
*G03F 7/00* (2006.01)

(52) U.S. Cl.
CPC ...... *G02F 1/133516* (2013.01); *G03F 7/0007* (2013.01); *G02B 5/201* (2013.01); *G02F 1/133512* (2013.01)

(58) Field of Classification Search
CPC . G02B 5/223; G03F 7/0007; G02F 1/133512; G02F 1/133514; G02F 1/133516
(Continued)

(56) References Cited

U.S. PATENT DOCUMENTS

| 2004/0189893 | A1* | 9/2004 | Choi | G02F 1/1334 |
| | | | | 349/86 |
| 2006/0284956 | A1 | 12/2006 | Chou | |
| 2007/0196568 | A1 | 8/2007 | Kim et al. | |

FOREIGN PATENT DOCUMENTS

| CN | 1523423 A | 8/2004 |
| CN | 1881024 A | 12/2006 |

(Continued)

OTHER PUBLICATIONS

Computer-generated translation of CN 102707565 (Oct. 2012). (Year: 2012).*

(Continued)

*Primary Examiner* — John A McPherson
(74) *Attorney, Agent, or Firm* — Intellectual Valley Law, P.C.

(57) ABSTRACT

The present application discloses a method of fabricating a color filter substrate, including forming a black matrix layer including forming a plurality of black matrices on a base substrate thereby defining a plurality of subpixel areas, the plurality of black matrices being formed to have a plurality of pores; dispensing a first color filter material in a plurality of first subpixel areas of the plurality of subpixel areas thereby forming a first color filter material layer, the first color filter material permeating into pores of black matrices adjacent to the plurality of first subpixel areas; and forming (Continued)

a first color filter layer. Subsequent to forming the first color filter layer, the first color filter material remains in at least a first portion of the black matrices adjacent to the plurality of first subpixel areas.

18 Claims, 4 Drawing Sheets

(58) Field of Classification Search
USPC .................................. 430/7; 349/106, 110
See application file for complete search history.

(56) References Cited

FOREIGN PATENT DOCUMENTS

| CN | 101013220 A |   | 8/2007 |
|----|-------------|---|--------|
| CN | 102707565 A | * | 10/2012 |
| JP | 0234803 A   |   | 2/1990 |

OTHER PUBLICATIONS

International Search Report & Written Opinion dated Nov. 27, 2017, regarding PCT/CN2017/077060.

* cited by examiner

FIG. 1

*Related Art*

COLOR FILTER SUBSTRATE AND METHOD OF FABRICATING A COLOR FILTER SUBSTRATE

CROSS-REFERENCE TO RELATED APPLICATION

This application is a national stage application under 35 U.S.C. § 371 of International Application No. PCT/CN2017/077060, filed Mar. 17, 2017, the contents of which are incorporated by reference in the entirety.

TECHNICAL FIELD

The present invention relates to display technology, more particularly, to a color filter substrate and a method of fabricating the color filter substrate.

BACKGROUND

Liquid crystal display apparatus have found a wide range of applications in display field. Typically, a liquid crystal display panel includes a color filter substrate and an array substrate facing each other. Thin film transistors, gate lines, data lines, pixel electrodes, common electrodes, and common electrode lines are disposed on the array substrate and color filter substrate. Between the two substrates, a liquid crystal material is injected to form a liquid crystal layer. The color filter substrate includes color filters filtering the light transmitted through the color filters, resulting in light of different colors for color display.

SUMMARY

In one aspect, the present invention provides a method of fabricating a color filter substrate, comprising forming a black matrix layer comprising forming a plurality of black matrices on a base substrate thereby defining a plurality of subpixel areas, the plurality of black matrices being formed to have a plurality of pores; dispensing a first color filter material in a plurality of first subpixel areas of the plurality of subpixel areas thereby forming a first color filter material layer, the first color filter material permeating into pores of black matrices adjacent to the plurality of first subpixel areas; and forming a first color filter layer, wherein subsequent to forming the first color filter layer, the first color filter material remains in at least a first portion of the black matrices adjacent to the plurality of first subpixel areas.

Optionally, forming the plurality of black matrices comprises forming a black matrix material layer on the base substrate using a black matrix material; removing the black matrix material in the plurality of subpixel areas; and forming the plurality of pores in the black matrix material layer.

Optionally, the black matrix material comprises a pore forming agent; and forming the plurality of pores in the black matrix material layer comprises removing at least a portion of the pore forming agent from the black matrix material layer.

Optionally, at least a portion of the pore forming agent undergoes microphase separation, forming a plurality of pore forming agent aggregates; and forming the plurality of pores in the black matrix material layer comprises removing at least a portion of the plurality of pore forming agent aggregates from the black matrix material layer.

Optionally, the pore forming agent is a water-soluble material; and removing the at least a portion of the pore forming agent from the black matrix material layer comprises washing the black matrix material layer with water.

Optionally, the pore forming agent comprises poly ethylene glycol.

Optionally, the pore forming agent comprises PEG400.

Optionally, the pore forming agent constitutes approximately 20% by weight to approximately 30% by weight of the black matrix material.

Optionally, the black matrix material comprises a photoresist resin material and is soluble in an alkaline developing solution.

Optionally, the black matrix material comprises a resin material, a black material, a cross-linking initiator, a dispersing agent, a solvent, and a pore forming agent.

Optionally, the cross-linking initiator is a photo-initiator, removing the black matrix material in the plurality of subpixel areas comprises exposing the black matrix material layer with a first mask plate and developing the black matrix material layer to remove the black matrix material in the plurality of subpixel areas; and forming the plurality of pores in the black matrix material layer comprises washing the black matrix material layer with water to remove at least a portion of the pore forming agent from the black matrix material layer.

Optionally, the resin material comprises one or more materials selected from the group consisting of an epoxy resin, a phenolic resin, acrylic resins such as ethylene glycol dimethacrylate and polyacrylate, amines such as tetraethylene pentaamine and polyamide, carboxylic acids such as acrylic acid, and unsaturated acid anhydride such as acrylic anhydride.

Optionally, the pore forming agent comprises one or more materials selected from the group consisting of poly ethylene glycol, hydroxy propyl cellulose, polyvidone, urea, and polyvinylpyrrolidone.

Optionally, the resin material constitutes approximately 5% by weight to approximately 8% by weight of the black matrix material; the black material constitutes approximately 5% by weight to approximately 8% by weight of the black matrix material; the dispersing agent constitutes approximately 5% by weight to approximately 8% by weight of the black matrix material; the solvent constitutes approximately 50% by weight to approximately 60% by weight of the black matrix material; the pore forming agent constitutes approximately 20% by weight to approximately 30% by weight of the black matrix material; and the cross-linking initiator constitutes approximately 0.2% by weight to approximately 0.6% by weight of the black matrix material.

Optionally, the first color filter material comprises a photoresist material; forming the first color filter layer comprises exposing the first color filter material layer with a second mask plate; and developing the first color filter material layer to remove the first color filter material in a region that is outside the plurality of first subpixel areas and outside the at least a first portion of the black matrices adjacent to the plurality of first subpixel areas.

Optionally, dispensing the first color filter material in the plurality of first subpixel areas comprises coating the first color filter material on the base substrate having the plurality of black matrices formed on the base substrate.

Optionally, dispensing the first color filter material in the plurality of first subpixel areas comprises ink-jet printing the first color filter material in the plurality of first subpixel areas; and forming the first color filter layer comprises curing the first color filter material in the first color filter material layer.

Optionally, the plurality of pores have a diameter in a range of approximately 10 nm to approximately 1000 nm.

Optionally, the method further comprises dispensing a second color filter material in a plurality of second subpixel areas thereby forming a second color filter material layer, the second color filter material permeating into pores of black matrices adjacent to the plurality of second subpixel areas; patterning the second color filter material layer to form a second color filter layer; dispensing a third color filter material in a plurality of third subpixel areas thereby forming a third color filter material layer, the third color filter material permeating into pores of black matrices adjacent to the plurality of third subpixel areas; patterning the third color filter material layer to form a third color filter layer; wherein subsequent to forming the second color filter layer, the second color filter material remains in at least a second portion of the black matrices adjacent to the plurality of second subpixel areas; and subsequent to forming the third color filter layer, the third color filter material remains in at least a third portion of the black matrices adjacent to the plurality of third subpixel areas.

In another aspect, the present invention provides a color filter substrate comprising a base substrate; a black matrix layer comprising a plurality of black matrices on the base substrate defining a plurality of subpixel areas, the plurality of black matrices having a plurality of pores; and a first color filter layer in a plurality of first subpixel areas of the plurality of subpixel areas, a first color filter material of the first color filter layer permeating into pores of at least a first portion of black matrices adjacent to the plurality of first subpixel areas; wherein the first color filter layer and the black matrices adjacent to the plurality of first subpixel areas are substantially leveled with each other.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
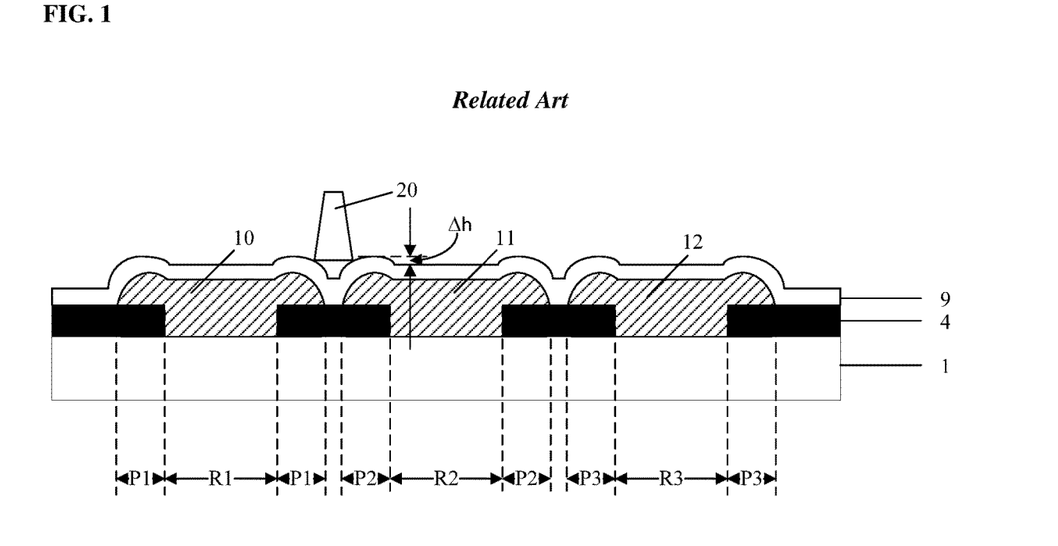
FIG. 1 is a schematic diagram illustrating the structure of a conventional color filter substrate.

In a conventional process of fabricating a conventional color filter substrate, typically a black matrix layer is first formed on a base substrate. The color filter layers are then formed on the black matrix layer. FIG. 1 is a schematic diagram illustrating the structure of a conventional color filter substrate. Referring to FIG. 1, the color filter substrate includes a black matrix layer having a plurality of black matrices 4, a first color filter layer 10, a second color filter layer 11, and a third color filter layer 12. To ensure that aperture areas defined by the black matrix layer is completely covered by the color filter layers, typically the color filter materials for forming the color filter layers are deposited in an area larger than the aperture area defined by the black matrix layer. For example, the black matrix layer in FIG. 1 defines a plurality of first subpixel areas R1, a plurality of second subpixel areas R2, and a plurality of third subpixel areas R3. When forming the first color filter layer 10, it is formed in an area larger than the plurality of first subpixel areas R1. Similarly, the second color filter layer 11 is formed in an area larger than the plurality of second subpixel areas R2, and the third color filter layer 12 is formed in an area larger than the plurality of third subpixel areas R3. As shown in FIG. 1, the first color filter layer 10 is formed in the plurality of first subpixel areas R1 and a first portion P1, the first color filter layer 10 overlaps with the black matrix layer in the first portion P1. Similarly, the second color filter layer 11 is formed in the plurality of second subpixel areas R2 and a second portion P2, the second color filter layer 11 overlaps with the black matrix layer in the second portion P2; and the third color filter layer 12 is formed in the plurality of third subpixel areas R3 and a third portion P3, the third color filter layer 12 overlaps with the black matrix layer in the third portion P3. Accordingly, an absolute height of the first color filter layer 10 in the first portion P1 is greater than that in the plurality of first subpixel areas R1, e.g., a normal distance from a surface of the first color filter layer 10 in the first portion P1 distal to the base substrate 1 to a surface of the base substrate 1 (e.g., the surface proximal to the first color filter layer 10) is larger than that in the plurality of first subpixel areas R1. Similarly, an absolute height of the second color filter layer 11 in the second portion P2 is greater than that in the plurality of second subpixel areas R2, and an absolute height of the third color filter layer 12 in the third portion P3 is greater than that in the plurality of third subpixel areas R3.

Height elevation in the portions of the color filter layers overlapping with the black matrix layer (e.g., the first portion P1, the second portion P2, and the third portion P3) is referred to as corner bumps (denoted as "Δh" in FIG. 1). In a liquid crystal display panel having the conventional color filter substrate, alignment of the liquid crystal molecules in a region of the color filter substrate having corner bumps is different from that in other regions. The presence of corner bumps thus affects light transmittance in the region of the color filter substrate having corner bumps, leading to light leakage in the region or non-uniform display on the display panel.

Accordingly, the present disclosure provides, inter alia, a color filter substrate and a method of fabricating the color filter substrate that substantially obviate one or more of the problems due to limitations and disadvantages of the related art. In one aspect, the present disclosure provides a method of fabricating a color filter substrate. In some embodiments, the method includes forming a black matrix layer which includes forming a plurality of black matrices on a base substrate thereby defining a plurality of subpixel areas, the plurality of black matrices being formed to have a plurality of pores; dispensing a first color filter material in a plurality of first subpixel areas of the plurality of subpixel areas thereby forming a first color filter material layer, the first color filter material permeating into pores of black matrices adjacent to the plurality of first subpixel areas; and forming a first color filter layer. Subsequent to the step of forming the first color filter layer, the first color filter material remains in at least a portion of the black matrices adjacent to the first color filter layer.

Figure 2A:
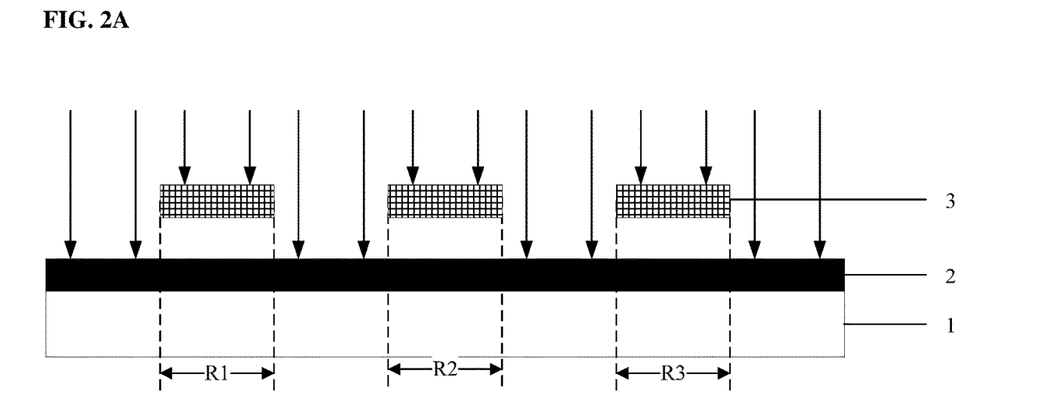
FIGS. 2A to 2F illustrate a process of fabricating a color filter substrate in some embodiments according to the present disclosure.

FIGS. 2A to 2F illustrate a process of fabricating a color filter substrate in some embodiments according to the present disclosure. Referring to FIG. 2A, the fabricating method in some embodiments includes forming a black matrix material layer 2 on the base substrate 1 using a black matrix material, and exposing the black matrix material layer 2 with a first mask plate 3 (e.g., using a UV light). For example, when the black matrix material layer 2 includes a negative photoresist layer, the step of exposing the black matrix material layer creates exposed portions and unexposed portions in the black matrix material layer. The unexposed portions correspond to a plurality of subpixel areas, e.g., a plurality of first subpixel areas R1, a plurality of second subpixel areas R2, and a plurality of third subpixel areas R3. In one example, the plurality of first subpixel areas R1, the plurality of second subpixel areas R2, and the plurality of third subpixel areas R3 are a plurality of red subpixel areas, a plurality of green subpixel areas, and a plurality of blue subpixel areas. Optionally, the black matrix material layer 2 includes a positive photoresist layer.

Figure 2B:
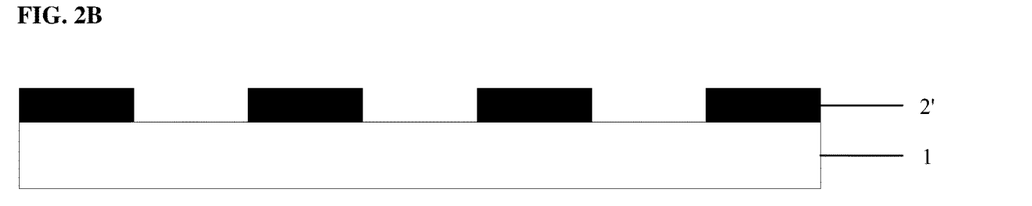

Subsequent to the step of exposing the black matrix material layer 2, the method in some embodiments further includes developing the black matrix material layer 2 to remove the black matrix material in the plurality of subpixel areas. Referring to FIG. 2B, subsequent to the step of developing the black matrix material layer 2, a plurality of spaces in the plurality of subpixel areas partitioned by a plurality of black material blocks 2' are formed on the base substrate 1.

Figure 2C:
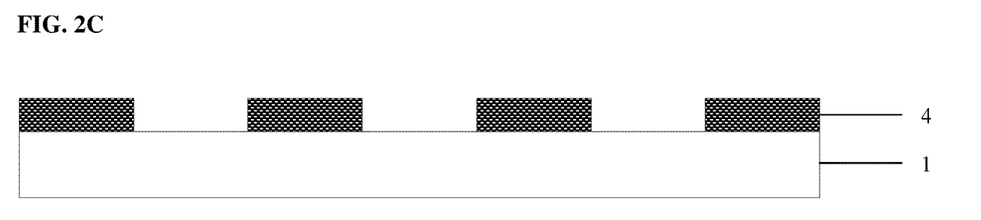

In some embodiments, the method further includes forming a plurality of pores in the plurality of black material blocks 2'. Optionally, the black matrix material includes a pore forming agent, and the plurality of pores are formed by removing at least a portion of the pore forming agent from the plurality of black material blocks 2'. FIG. 2C shows a plurality of black matrices 4 on the base substrate 1. The plurality of black matrices 4 are formed to have the plurality of pores.

Figure 3:
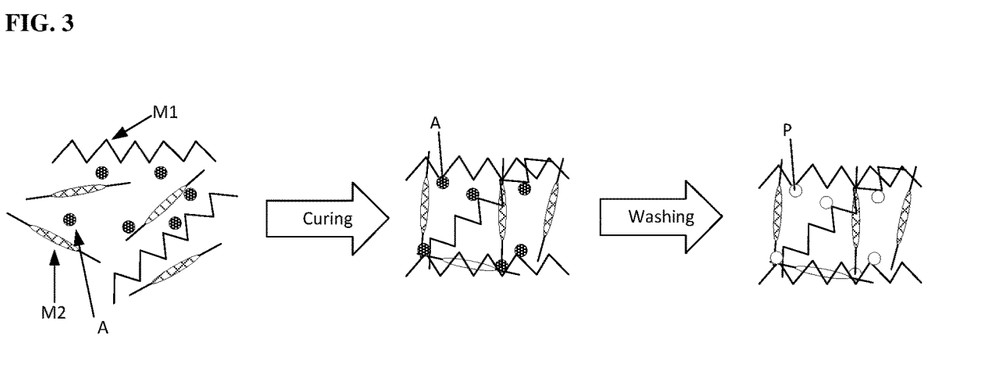
FIG. 3 illustrates a process of forming a plurality of pores in a black matrix in some embodiments according to the present disclosure.

FIG. 3 illustrates a process of forming a plurality of pores in a black matrix in some embodiments according to the present disclosure. Referring to FIG. 3, the black matrix material layer in some embodiments includes one or more cross-linkable molecules (e.g., a first monomer M1 and a second monomer M2 depicted in FIG. 3). Cross-linking of the cross-linkable molecules may be performed by heat. Optionally, cross-linking of the cross-linkable molecules is performed by irradiation (e.g., UV irradiation). Further, the black matrix material includes a pore forming agent. The pore forming agent is capable of undergoing microphase separation in the black matrix material layer, e.g., during or prior to the step of forming the black matrix material layer. Molecules of the pore forming agent forms a plurality of pore forming agent aggregates A as depicted in FIG. 3. When the plurality of pore forming agent aggregates A, or a portion of the plurality of pore forming agent aggregates A, are removed from the black matrix material layer, a plurality of pores P are formed in the black matrix material layer. Optionally, the cross-linkable molecules are photoresist resin materials.

In some embodiments, the step of removing the at least portion of the pore forming agent aggregates A from the black matrix material layer is performed by washing the black matrix material layer with a solvent, in which the pore forming agent is soluble while the black matrix material is substantially insoluble. For example, the black matrix material layer is typically made of a water-insoluble material, and the pore forming agent may be made of a water-soluble material. Optionally, the step of removing the at least a portion of the pore forming agent aggregates A from the black matrix material layer can be conveniently performed by washing the black matrix material layer with water.

Various appropriate pore forming agents may be used for forming the plurality of pores in the black matrices. Optionally, the pore forming agent is a molecule that is soluble in both water and at least some organic solvents, e.g., one or more organic solvents for formulating the black matrix material layer. Optionally, the pore forming agent is a molecule that is evenly distributed in an uncured black matrix material, e.g., before the black matrix material is cross-linked, but is capable of undergoing microphase separation during the curing process, e.g., as the cross-linkable molecules cross-link to form a polymeric scaffold structure. Examples of pore forming agents include, but are not limited to, poly ethylene glycol (PEG), hydroxy propyl cellulose, polyvidone, urea, and polyvinylpyrrolidone. Optionally, poly ethylene glycol is a low molecular weight poly ethylene glycol e.g., PEG400, PEG1000, and PEG3500.

At least some of the plurality of pores in the plurality of black matrices are connecting an outer surface (e.g., a side surface) of the plurality of black matrices to inside of the plurality of black matrices, so that at least some pores or a portion of pores are permeable to a solution. The porosity of the black matrices and the sizes of the plurality of pores may be controlled by adjusting one or more of several factors, e.g., a weight ratio of the pore forming agent in the black matrix material and a molecular weight of the pore forming agent. Optionally, the pore forming agent constitutes approximately 20% by weight to approximately 30% by weight of the black matrix material. Optionally, the pore forming agent includes poly ethylene glycol, and the porosity of the black matrices and the sizes of the plurality of pores may be controlled by selecting a poly ethylene glycol having an appropriate molecular weight. Optionally, the pore forming agent includes PEG400.

In some embodiments, the black matrix material includes a resin material. Optionally, the resin material is a cross-linkable resin material. In one example, the cross-linkable resin material may be cross-linked by heat. In another example, the cross-linkable resin material may be cross-linked by a hardener (e.g., amines and acid anhydrides). In another example, the cross-linkable resin material may be cross-linked by irradiation, e.g., by UV irradiation. Examples of appropriate resin materials include, but are not limited to, an epoxy resin, a phenolic resin, acrylic resins such as ethylene glycol dimethacrylate and polyacrylate, amines such as tetraethylene pentaamine and polyamide, carboxylic acids such as acrylic acid, and unsaturated acid anhydride such as acrylic anhydride. Optionally, the resin material constitutes approximately 5% by weight to approximately 8% by weight of the black matrix material.

In some embodiments, the black matrix material includes a black material. Examples of appropriate black materials include, but are not limited to, carbon, various organic dyes such as perylene black. Optionally, the black material constitutes approximately 5% by weight to approximately 8% by weight of the black matrix material.

In some embodiments, the black matrix material includes a dispersing agent, e.g., a pigment dispersant. Examples of appropriate dispersing materials include, but are not limited to, BYK® dispersing additives (BYK-CHEMIE GMBH), Solsperse™ pigment dispersants (The Lubrizol Corporation), AJISPER (Ajinomoto Fine-Techno Co. Inc.). Optionally, the dispersing agent constitutes approximately 5% by weight to approximately 8% by weight of the black matrix material.

In some embodiments, the black matrix material includes a solvent. Examples of appropriate solvents include, but are not limited to, formic acid, acetic acid, acetone, 2-propoxyethanol, ethyl acetate, cyclohexane, xylene, and isopropyl alcohol. Optionally, the solvent constitutes approximately 50% by weight to approximately 60% by weight of the black matrix material.

In some embodiments, the black matrix material includes a cross-linking initiator. Examples of appropriate cross-linking initiators include, but are not limited to, biimidazoles and biimidazoles derivatives, and benzophenones and benzophenones derivatives. Optionally, the cross-linking initiator constitutes approximately 0.2% by weight to approximately 0.6% by weight of the black matrix material.

In some embodiments, the cross-linkable resin material may be cross-linked by irradiation, e.g., by UV irradiation, e.g., the black matrix material includes a photoresist resin material. For example, the cross-linking initiator may be a photo-initiator. Referring to FIGS. 2A and 2B, the step of removing the black matrix material in the plurality of subpixel areas includes exposing the black matrix material layer 2 with a first mask plate 3; and developing the black matrix material layer 2 using a developing solution to remove the black matrix material in the plurality of subpixel areas. Optionally, the black matrix material is soluble in an alkaline developing solution. Referring to FIG. 2C, the step of forming the plurality of pores in the black matrix material layer 2 includes washing the black matrix material layer 2 with water to remove at least a portion of the pore forming agent from the black matrix material layer 2, thereby forming a plurality of black matrices 4. The plurality of black matrices 4 are formed to have the plurality of pores.

Figure 2D:
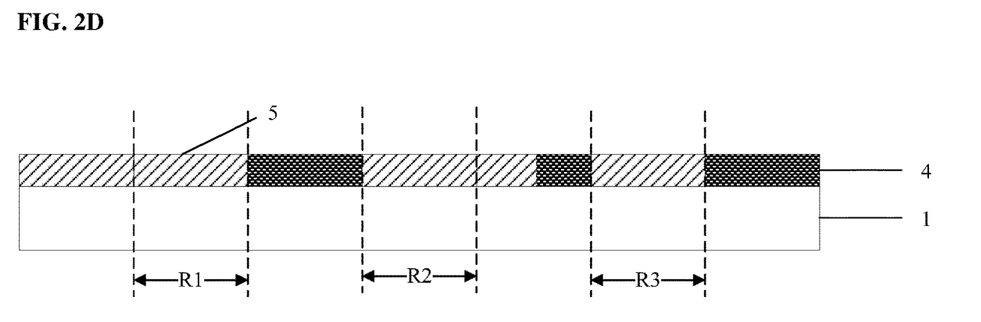

Subsequent to forming the plurality of black matrices having a plurality of pores, the method in some embodiments further includes dispensing a first color filter material in a plurality of first subpixel areas thereby forming a first color filter material layer. The first color filter material is dispersed so that the first color filter material permeates into pores of black matrices adjacent to the plurality of first subpixel areas. Optionally, the step of dispensing a first color filter material in the plurality of first subpixel areas includes coating the first color filter material on the base substrate having the plurality of black matrices formed on the base substrate prior to the step of coating the first color filter material. Referring to FIG. 2D, the first color filter material is coated in the plurality of first subpixel areas R1, the plurality of second subpixel areas R2, the plurality of third subpixel areas R3, and over the plurality of black matrices 4. Optionally, the first color filter material may be formed in the plurality of first subpixel areas R1 and a portion of the plurality of black matrices 4 adjacent to the plurality of first subpixel areas R1, but not in the plurality of second subpixel areas R2, the plurality of third subpixel areas R3, and other portions of the plurality of black matrices 4 adjacent to the plurality of second subpixel areas R2 and the plurality of third subpixel areas R3. As shown in FIG. 2D, the first color filter material permeates into pores of black matrices, e.g., the black matrices in a portion adjacent to the plurality of subpixel areas (e.g., the plurality of first subpixel areas R1) include the first color filter material.

Figure 2E:
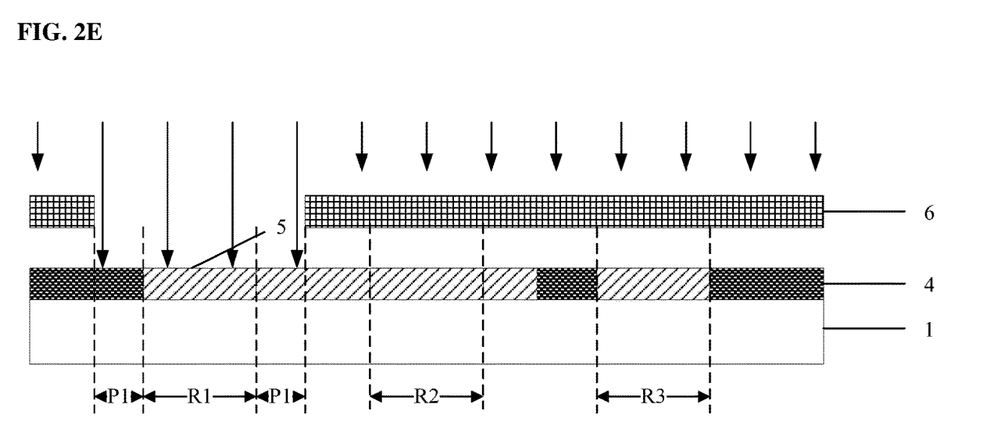

Referring to FIG. 2E, the first color filter material in some embodiments includes a photoresist material. The step of forming the first color filter layer in some embodiments includes exposing the first color filter material layer 5 with a second mask plate 6; and developing the first color filter material layer 5 to remove the first color filter material in a region that is outside the plurality of first subpixel areas R1 and outside the at least a first portion P1 of the black matrices 4 adjacent to the plurality of first subpixel areas R1.

Figure 2F:
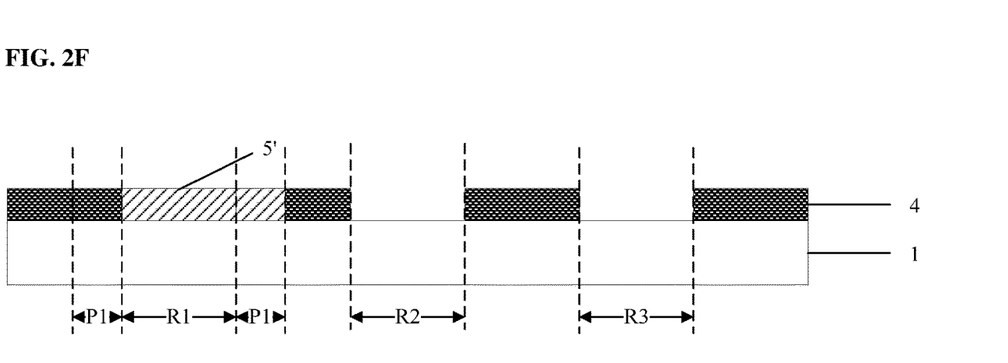

Referring to FIG. 2F, after the first color filter material is removed from the region that is outside the plurality of first subpixel areas R1 and outside the at least a first portion P1 of the black matrices 4 adjacent to the plurality of first subpixel areas R1, the first color filter layer 5' is formed. Subsequent to forming the first color filter layer 5', the first color filter material remains in the at least a first portion P1 of the black matrices 4 adjacent to the plurality of first subpixel areas R1.

In some embodiments, the plurality of subpixel areas further include a plurality of second subpixel areas and a plurality of third subpixel areas. The steps depicted in FIGS. 2E and 2F may be similarly performed for forming the second color filter layer and the third color filter layer. In some embodiments, the method includes dispensing a second color filter material in a plurality of second subpixel areas thereby forming a second color filter material layer, the second color filter material permeating into pores of black matrices adjacent to the plurality of second subpixel areas; patterning the second color filter material layer to form a second color filter layer; dispensing a third color filter material in a plurality of third subpixel areas thereby forming a third color filter material layer, the third color filter material permeating into pores of black matrices adjacent to the plurality of third subpixel areas; and patterning the third color filter material layer to form a third color filter layer. Subsequent to forming the second color filter layer, the second color filter material remains in at least a second portion of the black matrices adjacent to the plurality of second subpixel areas, e.g., the black matrices include the second color filter material in the at least a second portion of the black matrices adjacent to the plurality of second subpixel areas. Subsequent to forming the third color filter layer, the third color filter material remains in at least a third portion of the black matrices adjacent to the plurality of third subpixel areas, e.g., the black matrices include the third color filter material in the at least a third portion of the black matrices adjacent to the plurality of third subpixel areas.

Optionally, the step of dispensing the second color filter material in the plurality of second subpixel areas includes coating the second color filter material on the base substrate having the plurality of black matrices and the first color filter layer formed on the base substrate prior to the step of coating the second color filter material. Optionally, the second color filter material may be formed in the plurality of second subpixel areas and a portion of the plurality of black matrices adjacent to the plurality of second subpixel areas, but not in the plurality of first subpixel areas, the plurality of third subpixel areas, and other portions of the plurality of black matrices adjacent to the plurality of first subpixel areas and the plurality of third subpixel areas. The second color filter material includes a photoresist material. Optionally, the step of forming the second color filter layer includes exposing the second color filter material layer with a third mask plate; and developing the second color filter material layer to remove the second color filter material in a region that is outside the plurality of second subpixel areas and outside the at least a second portion of the black matrices adjacent to the plurality of second subpixel areas.

Optionally, the step of dispensing the third color filter material in the plurality of third subpixel areas includes coating the third color filter material on the base substrate having the plurality of black matrices, the first color filter layer, and the second color filter layer formed on the base substrate prior to the step of coating the third color filter material. Optionally, the third color filter material may be formed in the plurality of third subpixel areas and a portion of the plurality of black matrices adjacent to the plurality of third subpixel areas, but not in the plurality of first subpixel areas, the plurality of second subpixel areas, and other portions of the plurality of black matrices adjacent to the plurality of first subpixel areas and the plurality of second subpixel areas. The third color filter material includes a photoresist material. Optionally, the step of forming the third color filter layer includes exposing the third color filter material layer with a fourth mask plate; and developing the third color filter material layer to remove the third color filter material in a region that is outside the plurality of third subpixel areas and outside the at least a third portion of the black matrices adjacent to the plurality of third subpixel areas.

Figure 4A:
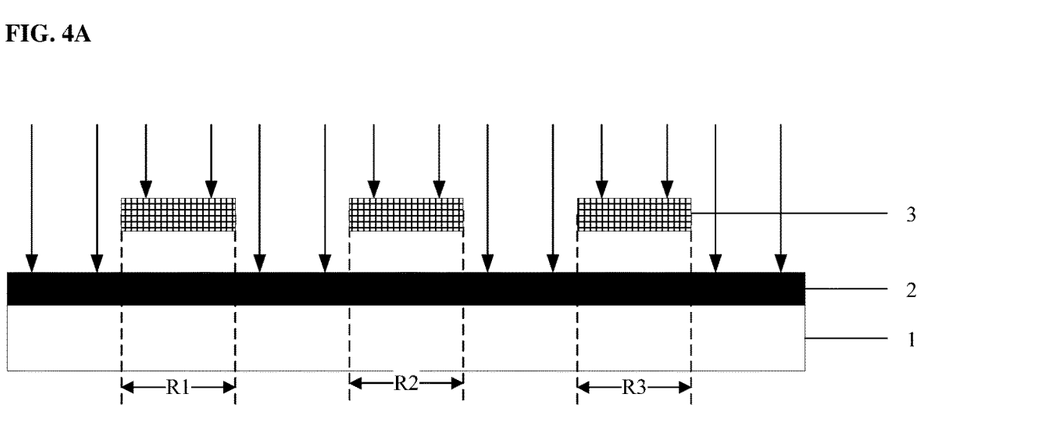
FIGS. 4A to 4D illustrate a process of fabricating a color filter substrate in some embodiments according to the present disclosure.
Figure 4B:
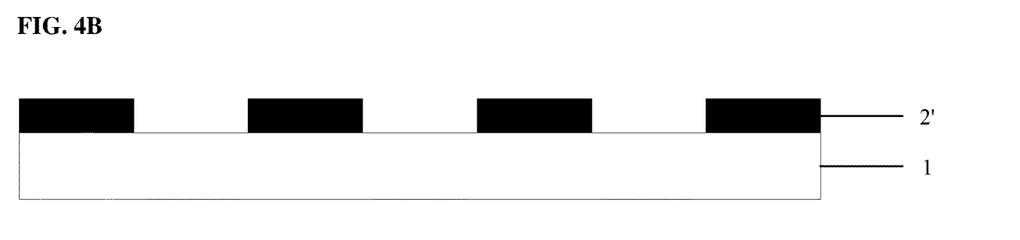
Figure 4C:
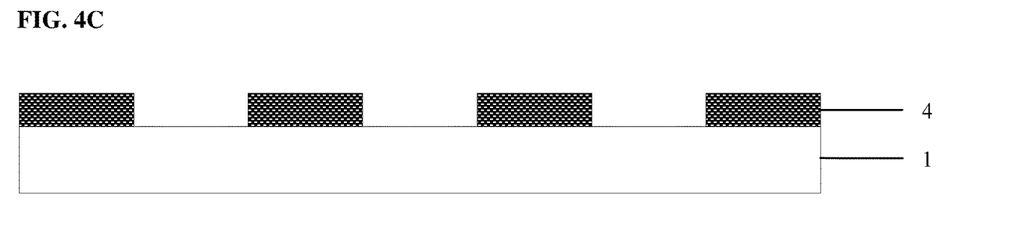
Figure 4D:
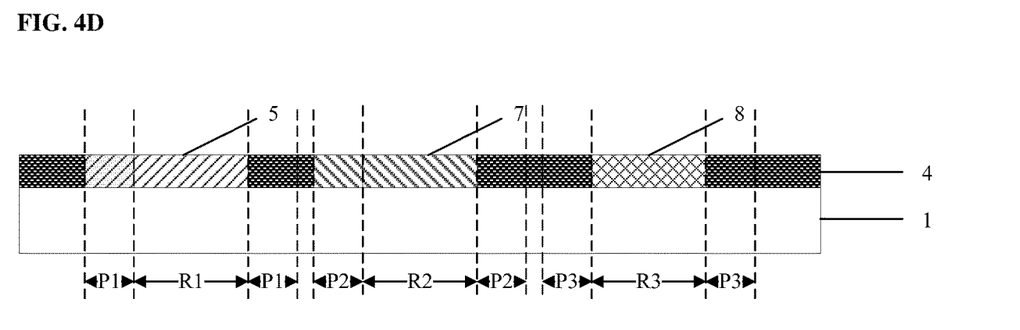

In some embodiments, the color filter materials may be ink-jet printed in the plurality of subpixel areas. FIGS. 4A to 4D illustrate a process of fabricating a color filter substrate in some embodiments according to the present disclosure. The steps depicted in FIGS. 4A to 4C are substantially similar to those depicted in FIGS. 2A to 2C. Referring to FIG. 4D, subsequent to forming the plurality of black matrices 4 having the plurality of pores, the method further includes dispensing the first color filter material in the plurality of first subpixel areas R1. Optionally, as shown in FIG. 4D, the step of dispensing the first color filter material in the plurality of first subpixel areas R1 includes ink-jet printing the first color filter material in the plurality of first subpixel areas R1, the first color filter material permeating into pores of black matrices adjacent to the plurality of first subpixel areas R1. Optionally, the step of forming the first color filter layer includes curing the first color filter material in the first color filter material layer 5, thereby forming the first color filter layer.

In some embodiments, the plurality of subpixel areas further include a plurality of second subpixel areas and a plurality of third subpixel areas. The steps for forming the first color filter layer may be similarly performed for forming the second color filter layer and the third color filter layer. In some embodiments, the method includes dispensing a second color filter material in a plurality of second subpixel areas thereby forming a second color filter material layer, the second color filter material permeating into pores of black matrices adjacent to the plurality of second subpixel areas; forming a second color filter layer dispensing a third color filter material in a plurality of third subpixel areas thereby forming a third color filter material layer, the third color filter material permeating into pores of black matrices adjacent to the plurality of third subpixel areas; and forming a third color filter layer.

Referring to FIG. 4D, the step of dispensing the second color filter material in the plurality of second subpixel areas R2 in some embodiments includes ink-jet printing the second color filter material in the plurality of second subpixel areas R2 to form a second color filter material layer 7. Optionally, the step of forming the second color filter layer includes curing the second color filter material in the second color filter material layer 7, thereby forming the second color filter layer. Subsequent to forming the second color filter layer, the second color filter material remains in at least a second portion P2 of the black matrices 4 adjacent to the plurality of second subpixel areas R2, e.g., the black matrices 4 include the second color filter material in the at least a second portion P2 of the black matrices 4 adjacent to the plurality of second subpixel areas R2.

Referring to FIG. 4D, the step of dispensing the third color filter material in the plurality of third subpixel areas R3 in some embodiments includes ink-jet printing the third color filter material in the plurality of third subpixel areas R3 to form a third color filter material layer 8. Optionally, the step of forming the third color filter layer includes curing the third color filter material in the third color filter material layer 8, thereby forming the third color filter layer. Subsequent to forming the third color filter layer, the third color filter material remains in at least a third portion P3 of the black matrices 4 adjacent to the plurality of third subpixel areas R3, e.g., the black matrices 4 include the third color filter material in the at least a third portion P3 of the black matrices 4 adjacent to the plurality of third subpixel areas R3.

Optionally, the plurality of pores have a diameter in a range of approximately 10 nm to approximately 1000 nm.

In another aspect, the present disclosure provides a color filter substrate fabricated by a method described herein.

Figure 5:
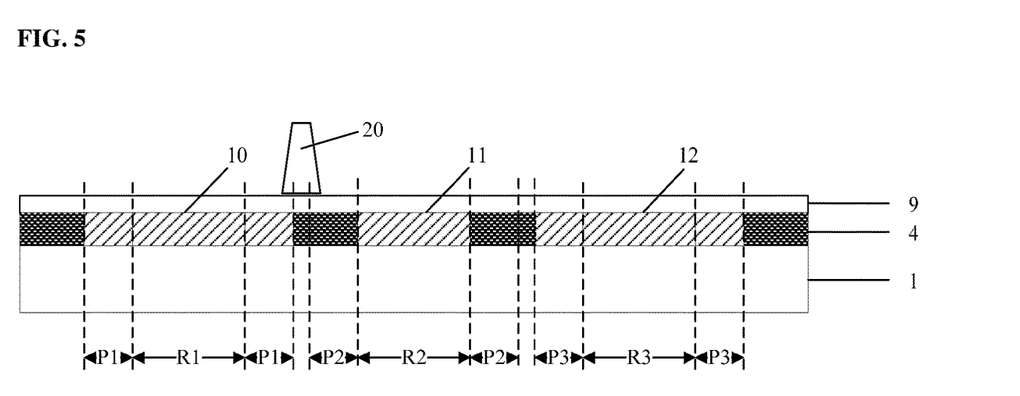
FIG. 5 is a schematic diagram illustrating the structure of a color filter substrate in some embodiments according to the present disclosure.

In another aspect, the present disclosure provides a color filter substrate. FIG. 5 is a schematic diagram illustrating the structure of a color filter substrate in some embodiments according to the present disclosure. Referring to FIG. 5, the color filter substrate in some embodiments includes a black matrix layer having a plurality of black matrices 4 on a base substrate 1, the black matrices defining a plurality of subpixel areas, the plurality of subpixel areas including a plurality of first subpixel areas R1; and a first color filter layer 10 in the plurality of first subpixel areas R1, the first color filter layer 10 including a first color filter material. In the present color filter substrate, the plurality of black matrices 4 include a plurality of pores, and the first color filter material permeates into pores of black matrices adjacent to the plurality of first subpixel areas R1. As shown in FIG. 5, the first color filter material permeates into a first portion P1 of the black matrices 4 adjacent to the plurality of first subpixel areas R1. Optionally, the color filter substrate further includes a second color filter layer 11 in the plurality of second subpixel areas R2, the second color filter layer 11 including a second color filter material; and a third color filter layer 12 in the plurality of third subpixel areas R3, the third color filter layer 12 including a third color filter material. Optionally, the second color filter material permeates into pores of black matrices adjacent to the plurality of second subpixel areas R2, and the third color filter material permeates into pores of black matrices adjacent to the plurality of third subpixel areas R3. As shown in FIG. 5, the second color filter material permeates into a second portion P2 of the black matrices 4 adjacent to the plurality of second subpixel areas R2, and the third color filter material permeates into a third portion P3 of the black matrices 4 adjacent to the plurality of third subpixel areas R3.

Optionally, the first color filter layer 10 and the black matrices 4 adjacent to the plurality of first subpixel areas R1 are substantially leveled with each other, e.g., substantially on a same horizontal plane. The black matrices 4 adjacent to the plurality of first subpixel areas R1 are substantially free of first color filter material on a side of the black matrices 4 distal to the base substrate 1 (e.g., no corner bumps). Optionally, the second color filter layer 11 and the black matrices 4 adjacent to the plurality of second subpixel areas R2 are substantially leveled with each other, e.g., substantially on a same horizontal plane. The black matrices 4 adjacent to the plurality of second subpixel areas R2 are substantially free of second color filter material on a side of the black matrices 4 distal to the base substrate 1 (e.g., no corner bumps). Optionally, the third color filter layer 12 and the black matrices 4 adjacent to the plurality of third subpixel areas R3 are substantially leveled with each other, e.g., substantially on a same horizontal plane. The black matrices 4 adjacent to the plurality of third subpixel areas R3 are substantially free of third color filter material on a side of the black matrices 4 distal to the base substrate 1 (e.g., no corner bumps).

In the present color filter substrate, the structure having the color filter layers and the plurality of black matrices has a substantially uniform thickness. For example, the color filter substrate has a substantially uniform thickness over the entire color filter substrate. Because the black matrices have a plurality pores that can absorb color filter materials, the color filter materials coated or printed in portions of black matrices adjacent to the plurality of subpixel areas permeate into the black matrices, e.g., in the first portion P1, the second portion P2, and the third portion P3. Thus, the color filter materials substantially do not overlay the black matrices, and the thickness of the black matrices is not increased by the color filter materials coated or printed in these portions.

Optionally, the first portion P1 has a thickness substantially the same as that of the first color filter layer 10. Optionally, the second portion P2 has a thickness substantially the same as that of the second color filter layer 11. Optionally, the third portion P3 has a thickness substantially the same as that of the third color filter layer 12. Optionally, thicknesses of the first portion P1, the second portion P2, the third portion P3, the first color filter layer 10, the second color filter layer 11, and the third color filter layer 12 are substantially the same.

Optionally, a normal distance from a surface of the first color filter layer 10 distal to the base substrate 1 to a surface of the base substrate 1 (e.g., the surface proximal to the black matrix layer and the color filter layers) is substantially uniform throughout the color filter substrate. Optionally, a normal distance from a surface of the second color filter layer 11 distal to the base substrate 1 to a surface of the base substrate 1 (e.g., the surface proximal to the black matrix layer and the color filter layers) is substantially uniform throughout the color filter substrate. Optionally, a normal distance from a surface of the third color filter layer 12 distal to the base substrate 1 to a surface of the base substrate 1 (e.g., the surface proximal to the black matrix layer and the color filter layers) is substantially uniform throughout the color filter substrate.

In the present color filter substrate, the color filter materials permeate into the adjacent black matrices, enhancing the structural stability of the color filter layers. Once the color filter materials are cured, the extensions of color filter materials in the adjacent black matrices stabilize the color filter layer. The color filter layer is less prone to dislodging from the color filter substrate.

Referring to FIG. 5, the color filter substrate further includes an overcoat layer 9 on a side of the black matrix layer and the color filter layers distal to the base substrate 1. Optionally, a normal distance from a surface of the overcoat layer 9 distal to the base substrate 1 to a surface of the base substrate 1 (e.g., the surface proximal to the overcoat layer 9) is substantially uniform throughout the overcoat layer 9.

In another aspect, the present disclosure provides a display panel having a color filter substrate described herein or fabricated by a method described herein.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a color filter substrate, comprising:
    forming a black matrix layer comprising forming a plurality of black matrices on a base substrate thereby defining a plurality of subpixel areas, the plurality of black matrices being formed to have a plurality of pores;
    dispensing a first color filter material in a plurality of first subpixel areas of the plurality of subpixel areas thereby forming a first color filter material layer, the first color filter material permeating into pores of black matrices adjacent to the plurality of first subpixel areas; and
    forming a first color filter layer;
    wherein subsequent to forming the first color filter layer, the first color filter material remains in at least a first portion of the black matrices adjacent to the plurality of first subpixel areas;
    wherein forming the plurality of black matrices comprises:
    forming a black matrix material layer on the base substrate using a black matrix material;

removing the black matrix material in the plurality of subpixel areas; and forming the plurality of pores in the black matrix material layer;

wherein the black matrix material comprises a pore forming agent; and forming the plurality of pores in the black matrix material layer comprises removing at least a portion of the pore forming agent from the black matrix material layer.

2. The method of claim 1, wherein at least a portion of the pore forming agent undergoes microphase separation, forming a plurality of pore forming agent aggregates; and forming the plurality of pores in the black matrix material layer comprises removing at least a portion of the plurality of pore forming agent aggregates from the black matrix material layer.

3. The method of claim 1, wherein the pore forming agent is a water-soluble material; and removing the at least a portion of the pore forming agent from the black matrix material layer comprises washing the black matrix material layer with water.

4. The method of claim 3, wherein the pore forming agent comprises poly ethylene glycol.

5. The method of claim 4, wherein the pore forming agent comprises PEG400.

6. The method of claim 1, wherein the pore forming agent constitutes approximately 20% by weight to approximately 30% by weight of the black matrix material.

7. The method of claim 1, wherein the black matrix material comprises a photoresist resin material and is soluble in an alkaline developing solution.

8. The method of claim 1, wherein dispensing the first color filter material in the plurality of first subpixel areas comprises ink-jet printing the first color filter material in the plurality of first subpixel areas; and forming the first color filter layer comprises curing the first color filter material in the first color filter material layer.

9. The method of claim 1, wherein the plurality of pores have a diameter in a range of approximately 10 nm to approximately 1000 nm.

10. The method of claim 1, further comprising:

dispensing a second color filter material in a plurality of second subpixel areas thereby forming a second color filter material layer, the second color filter material permeating into pores of black matrices adjacent to the plurality of second subpixel areas;

patterning the second color filter material layer to form a second color filter layer;

dispensing a third color filter material in a plurality of third subpixel areas thereby forming a third color filter material layer, the third color filter material permeating into pores of black matrices adjacent to the plurality of third subpixel areas;

patterning the third color filter material layer to form a third color filter layer;

wherein subsequent to forming the second color filter layer, the second color filter material remains in at least a second portion of the black matrices adjacent to the plurality of second subpixel areas; and subsequent to forming the third color filter layer, the third color filter material remains in at least a third portion of the black matrices adjacent to the plurality of third subpixel areas.

11. A method of fabricating a color filter substrate, comprising:

forming a black matrix layer comprising forming a plurality of black matrices on a base substrate thereby defining a plurality of subpixel areas, the plurality of black matrices being formed to have a plurality of pores;

dispensing a first color filter material in a plurality of first subpixel areas of the plurality of subpixel areas thereby forming a first color filter material layer, the first color filter material permeating into pores of black matrices adjacent to the plurality of first subpixel areas; and forming a first color filter layer;

wherein subsequent to forming the first color filter layer, the first color filter material remains in at least a first portion of the black matrices adjacent to the plurality of first subpixel areas;

wherein forming the plurality of black matrices comprises:

forming a black matrix material layer on the base substrate using a black matrix material;

removing the black matrix material in the plurality of subpixel areas; and forming the plurality of pores in the black matrix material layer;

wherein the black matrix material comprises a resin material, a black material, a cross-linking initiator, a dispersing agent, a solvent, and a pore forming agent.

12. The method of claim 11, wherein the cross-linking initiator is a photo-initiator;

removing the black matrix material in the plurality of subpixel areas comprises:

exposing the black matrix material layer with a first mask plate; and developing the black matrix material layer to remove the black matrix material in the plurality of subpixel areas; and forming the plurality of pores in the black matrix material layer comprises:

washing the black matrix material layer with water to remove at least a portion of the pore forming agent from the black matrix material layer.

13. The method of claim 11, wherein the resin material comprises one or more materials selected from the group consisting of an epoxy resin, a phenolic resin, an acrylic resin, an amine, a carboxylic acid, and an unsaturated acid anhydride.

14. The method of claim 13, wherein the acrylic resins comprises one or more materials selected from the group consisting of ethylene glycol dimethacrylate and polyacrylate;

the amine comprises one or more materials selected from the group consisting of tetraethylene pentaamine and polyamide;

the carboxylic acid is acrylic acid; and the unsaturated acid anhydride is acrylic anhydride.

15. The method of claim 11, wherein the pore forming agent comprises one or more materials selected from the group consisting of poly ethylene glycol, hydroxy propyl cellulose, polyvidone, urea, and polyvinylpyrrolidone.

16. The method of claim 11, wherein the resin material constitutes approximately 5% by weight to approximately 8% by weight of the black matrix material;

the black material constitutes approximately 5% by weight to approximately 8% by weight of the black matrix material;

the dispersing agent constitutes approximately 5% by weight to approximately 8% by weight of the black matrix material;

the solvent constitutes approximately 50% by weight to approximately 60% by weight of the black matrix material;

the pore forming agent constitutes approximately 20% by weight to approximately 30% by weight of the black matrix material; and the cross-linking initiator constitutes approximately 0.2% by weight to approximately 0.6% by weight of the black matrix material.

17. A method of fabricating a color filter substrate, comprising:

forming a black matrix layer comprising forming a plurality of black matrices on a base substrate thereby defining a plurality of subpixel areas, the plurality of black matrices being formed to have a plurality of pores;

dispensing a first color filter material in a plurality of first subpixel areas of the plurality of subpixel areas thereby forming a first color filter material layer, the first color filter material permeating into pores of black matrices adjacent to the plurality of first subpixel areas; and forming a first color filter layer;

wherein subsequent to forming the first color filter layer, the first color filter material remains in at least a first portion of the black matrices adjacent to the plurality of first subpixel areas;

wherein forming the plurality of black matrices comprises:

forming a black matrix material layer on the base substrate using a black matrix material;

removing the black matrix material in the plurality of subpixel areas; and forming the plurality of pores in the black matrix material layer;

wherein the first color filter material comprises a photoresist material;

forming the first color filter layer comprises:

exposing the first color filter material layer with a second mask plate; and developing the first color filter material layer to remove the first color filter material in a region that is outside the plurality of first subpixel areas and outside the at least a first portion of the black matrices adjacent to the plurality of first subpixel areas.

18. The method of claim 17, wherein dispensing the first color filter material in the plurality of first subpixel areas comprises:

coating the first color filter material on the base substrate having the plurality of black matrices formed on the base substrate.

* * * * *